United States Patent
Aparin (10) Patent No.: US 7,853,235 B2
(45) Date of Patent: Dec. 14, 2010

(54) FIELD EFFECT TRANSISTOR AMPLIFIER WITH LINEARIZATION

(75) Inventor: Vladimir Aparin, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 384 days.

(21) Appl. No.: 10/920,526

(22) Filed: Aug. 17, 2004

(65) Prior Publication Data

US 2005/0176399 A1    Aug. 11, 2005
US 2008/0242257 A9    Oct. 2, 2008

Related U.S. Application Data

(60) Provisional application No. 60/558,387, filed on Mar. 31, 2004, provisional application No. 60/544,282, filed on Feb. 11, 2004.

(51) Int. Cl.
*H04B 1/16* (2006.01)
*H04B 1/10* (2006.01)

(52) U.S. Cl. .............. 455/341; 455/278.1; 455/295

(58) Field of Classification Search ............ 455/144, 455/341, 277.2, 278.1, 296, 253.2, 252.1, 455/114.2, 114.3, 293; 330/251, 277, 269, 330/250, 285
See application file for complete search history.

(56) References Cited

U.S. PATENT DOCUMENTS

| | | | | |
|---|---|---|---|---|
| 4,621,239 | A * | 11/1986 | Tserng | 331/99 |
| 6,271,695 | B1 | 8/2001 | Gramegna et al. | |
| 6,674,341 | B2 * | 1/2004 | Hieda et al. | 333/164 |
| 6,693,498 | B1 * | 2/2004 | Sasabata et al. | 333/103 |
| 6,819,184 | B2 * | 11/2004 | Pengelly et al. | 330/295 |
| 7,030,703 | B2 * | 4/2006 | Zimmerman | 330/310 |
| 2003/0020563 | A1 * | 1/2003 | Hieda et al. | 333/164 |
| 2007/0044024 | A1 * | 2/2007 | Na et al. | 715/733 |

OTHER PUBLICATIONS

Aparin, V., et al. (2003) Analysis and reduction of cross-modulation distortion in CDMA receivers. IEEE Transactions on Microwave Theory and Techniques, 51(5), pp. 1591-1602, May 2003.
Brinkhoff, J., et al. (2003) Baseband Impedance and Linearization of FET circuits. IEEE Transactions on Microwave Theory and Techniques 51(12) pp. 2523-2530, (Dec. 2003).
Katzin, P., et al. (1994) Active, self-adjusting L-S band MMIC filters. IEEE, GaAs IC Symposium pp. 41-44, Mar. 1994.
International Search Report-PCT/US2005/003155, International Search Authority-European Patent Office, Jun. 28, 2005.
V. Aparin G. Brown, and L.E. Larson, "Linearization of CMOS LNAs via optimum gate biasing," IEEE Int. Symp. On Circ. And Sys., May 2004.
T.W. Kim, B. Kim and K. Lee, "Highly linear receiver front-end adopting MOSFET transconductance linearization by multiple gated transistors," IEEE J. solid-Staet Circuits, vol. 30, No. 1 pp. 223-229, Jan. 2004.
Y. Ding and R. Harjani, "A +18dBm IIP3 LNA in 0.35 CMOS," IEEE ISSCC, pp. 162-163, 2001.
Aparin, V.; Larson, L.E.; "Modified derivative superposition method for linearizing FET low-noise amplifiers", Microwave Theory and Techniques, IEEE Transactions on, vol. 53, Issue 2, Feb. 2005 pp. 571-581.

* cited by examiner

*Primary Examiner*—Sonny Trinh
(74) *Attorney, Agent, or Firm*—Nicholas J. Pauley; William M. Hooks (57) ABSTRACT

An amplifier comprises a source degeneration inductance and at least two field effect transistors coupled in parallel and having mutually different gate biasing. Source connections of the field effect transistors are coupled along different positions of the source degeneration inductance.

19 Claims, 9 Drawing Sheets

FIELD EFFECT TRANSISTOR AMPLIFIER WITH LINEARIZATION

RELATED APPLICATIONS

This application claims priority to U.S. Provisional Application No. 60/544,282 filed Feb. 11, 2004 and U.S. Provisional Application No. 60/558,387 filed Mar. 31, 2004.

BACKGROUND OF THE INVENTION

Receivers in communication systems commonly incorporate one or more low noise amplifiers (LNAs) with suitable performance characteristics. For example single-tone desensitization for code division multiple access (CDMA) telephones generally specify a very high LNA third-order intercept point $IIP_3$ in combination with low noise factor (NF), high gain, and low current consumption. Linearization techniques are commonly used to attain appropriate performance.

For example, feed-forward distortion cancellation has been used to attain a very high $IIP_3$ for a complementary metal-oxide semiconductor (CMOS) low noise amplifier. Feed-forward distortion cancellation has not been widely adopted because of high sensitivity to mismatches between main and auxiliary gain stages and errors in input signal scaling.

A field-effect transistor can also be linearized by biasing at a gate-source voltage ($V_{GS}$) at which a third-order derivative of the transistor DC transfer characteristic is zero. Resulting transistor third-order intercept point $IIP_3$ peaks in a very narrow range of $V_{GS}$, making the technique very sensitive to bias variations.

A derivative superposition (DS) method has been used to reduce third-order intercept point $IIP_3$ sensitivity to bias. Derivative superposition uses two or more parallel field-effect transistors of different gate widths and gate biases to attain a composite DC transfer characteristic with an extended $V_{GS}$ range in which the third-order derivative is close to zero. However, the third-order intercept point $IIP_3$ improvement attained is only modest at radio frequency, for example about 3 dB. Reducing source degeneration inductance and drain load impedance at a second-harmonic frequency of a composite input transistor allows an increase in third-order intercept point $IIP_3$ by as much as 10 dB. One disadvantage of the derivative superposition technique is a resulting higher noise factor, for example in a range of about 0.6 dB.

The conventional derivative superposition method does not significantly increase third-order intercept point $IIP_3$ at radio frequency due to the contribution of second-order nonlinearity to third-order intermodulation distortion ($IMD_3$). In general, the vector of the second-order contribution is not collinear with the vector of the third-order contribution and, therefore, the contributions do not mutually cancel.

SUMMARY

In accordance with an embodiment of an illustrative communication apparatus, an amplifier comprises a source degeneration inductance and at least two field effect transistors coupled in parallel and having mutually different gate biasing. Source connections of the field effect transistors are coupled along different positions of the source degeneration inductance.

BRIEF DESCRIPTION OF THE DRAWINGS

Embodiments of the invention relating to both structure and method of operation, may best be understood by referring to the following description and accompanying drawings.

DETAILED DESCRIPTION

A novel modified derivative superposition method attains a very high third-order intercept point $IIP_3$ at radio frequency. The illustrative derivative superposition method creates opposing phases of second and third-order contributions to third-order intermodulation distortion ($IMD_3$) by using a controlled inductance for source degeneration of a composite field-effect transistor. In an illustrative embodiment, the modified derivative superposition method implements a tapped inductor for source degeneration. The modified method increases third-order intercept point $IIP_3$ of a low noise amplifier embodiment. In a specific implementation, $IIP_3$ is boosted by 15 dB.

Figure 1:
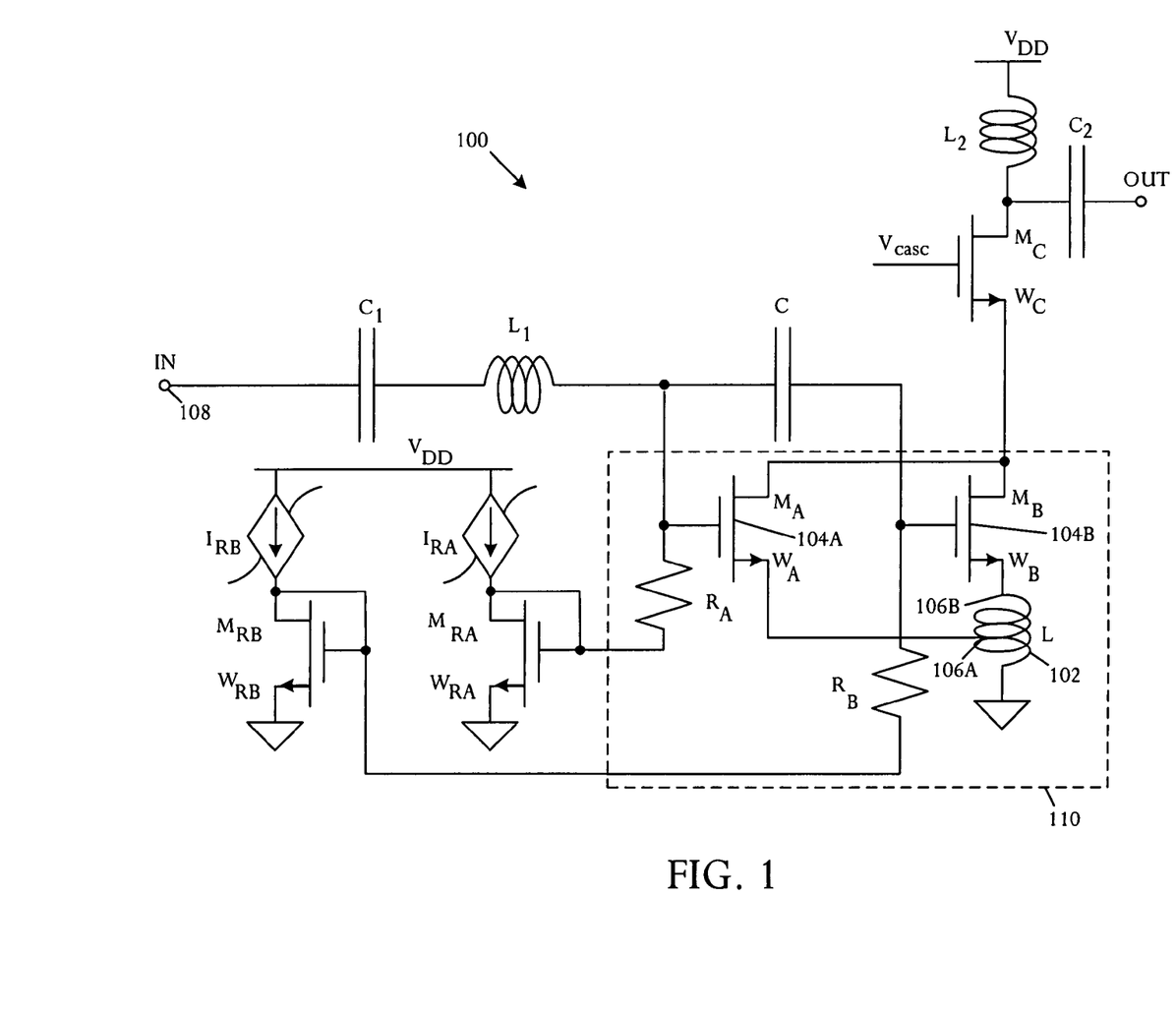
FIG. 1 is a schematic circuit diagram illustrating an embodiment of an amplifier comprising a source degeneration inductance and at least two field effect transistors coupled in parallel and having mutually different gate biasing.

Referring to FIG. 1, a schematic circuit diagram illustrates an amplifier 100 that comprises a source degeneration inductance 102 and at least two field effect transistors 104A, 104B coupled in parallel and having mutually different gate biasing. Source connections of the field effect transistors are coupled along different positions of the source degeneration inductance 102. The illustrative amplifier 100 includes a source degeneration inductance 102 that is a tapped inductor. Source connections of the field effect transistors 104A, 104B are connected to respective taps 106A, 106B of the source generation inductance 102 whereby at least one of the field effect transistors 104B is biased in strong inversion and at least one of the field effect transistors 104A is biased in weak inversion.

The first and second field-effect transistors 104A, 104B and source generation inductance 102 form a modified-derivative superposition element 110. The first and second field-effect transistors 104A, 104B each have a gate coupled to a common input signal 108, a mutually coupled drain, and a source coupled respectively to the source generation inductance 102.

Figure 2:
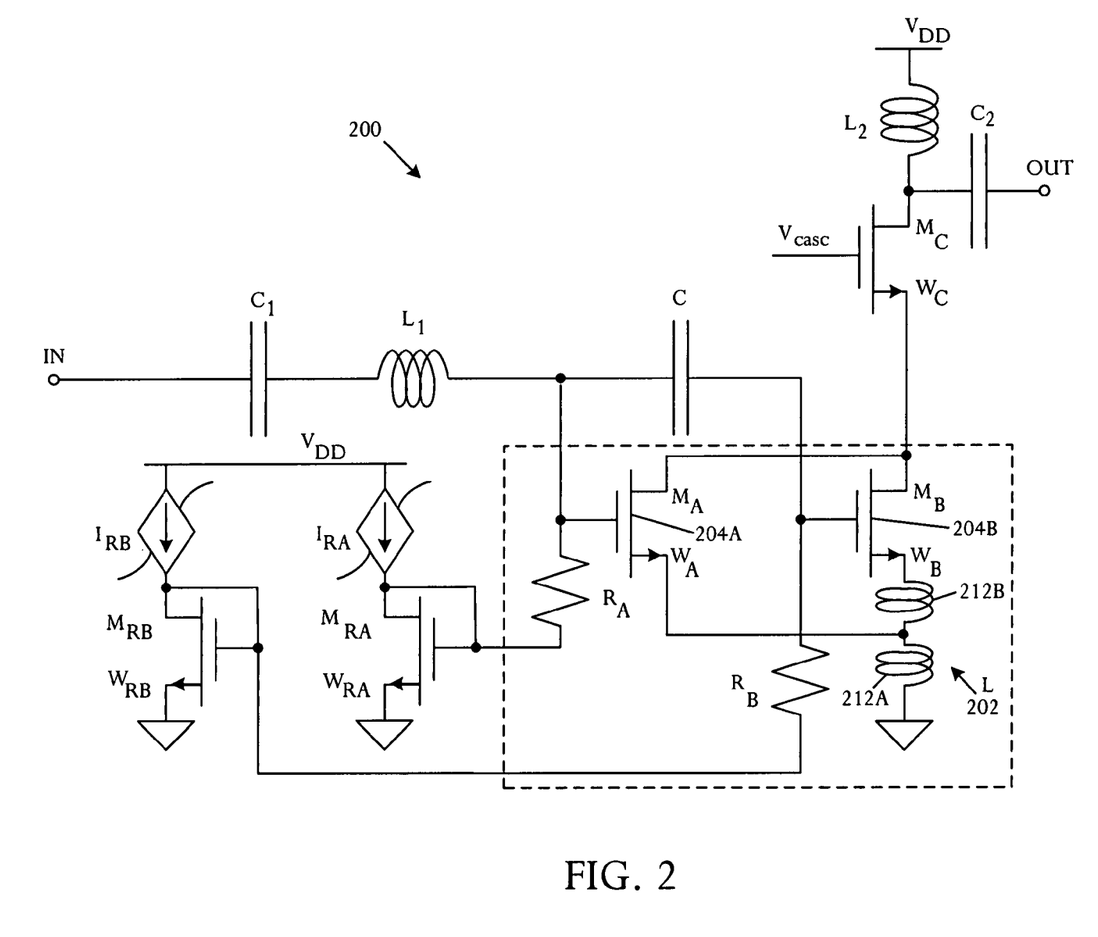
FIG. 2 is a schematic circuit diagram showing an alternative embodiment of a transistor in which a source degeneration inductance includes at least two inductors connected in series.

In the illustrative embodiment, the amplifier 100 includes two field-effect transistors 104A, 104B with mutually-connected drains. Gates of the two field-effect transistors 104A, 104B are driven by the same input signal but have different direct current bias voltages. Sources are connected to ground through either one inductor 102 with end terminals and a tap, or two inductors in series 212A, 212B as shown in FIG. 2.

The illustrative low noise amplifier 100 and associated derivative superposition method can significantly increase third-order intercept point $IIP_3$ at radio frequency (RF) even without completely eliminating a second-order contribution to third-order intermodulation distortion ($IMD_3$). A suitable improvement can be attained by attaining a second-order contribution approximately the same magnitude and opposite in phase with the third-order contribution.

In contrast to a conventional derivative scaling technique in which the second-order contribution is optimally scaled and rotated by tuning second-harmonic terminations of the composite field-effect transistor, the illustrative technique uses a tapped inductor 102 for source degeneration to adjust magnitude and phase of the third-order contribution. The tapped inductor 102 can be used to conserve die area on an integrated circuit chip implementation. Alternatively, as shown in FIG. 2, the inductance can be replaced by multiple inductors 212A and 212B coupled in series.

Referring again to FIG. 1, a first field-effect transistor (T1) 104A is biased in weak inversion with a positive associated third-order transconductance coefficient ($g_{3T1}$) and a second field-effect transistor (T2) 104B is biased in strong inversion with a negative associated third-order transconductance coefficient ($g_{3T2}$). First-order transconductance coefficient contributions $g_{1T1}$ and $g_{1T2}$ are negligible to the overall response of the amplifier 100.

The source of the first field-effect transistor (T1) 104A is connected to a tap 106A of the source degeneration inductance 102 in a configuration that changes magnitude and phase of the associated third-order transconductance coefficient ($g_{3T1}$) contribution to the third-order intermodulation distortion ($IMD_3$) relative to the second-order transconductance coefficient ($g_{2T2}$) and third-order transconductance coefficient ($g_{3T2}$) contributions associated to the second field-effect transistor (T2) 104B. With proper selection of the tapping point 106A, 106B and field-effect transistor widths and biases, the overall third-order intermodulation distortion ($IMD_3$) can be reduced to zero or effectively zero for a wide range of bias.

The illustrative amplifier 100 and design methodology does not require the degeneration inductance 102 to be minimized and therefore enables simultaneous noise-power matching. Furthermore, the illustrative amplifier 100 and design methodology facilitate stability since the third-order intercept point $IIP_3$ is very insensitive to input termination at the second-harmonic frequency.

Referring to FIG. 2, a schematic circuit diagram illustrates an alternative embodiment of a transistor 200 in which a source degeneration inductance 202 includes at least two inductors 212A and 212B coupled in series with source connections of at least two field effect transistors 204A, 204B coupled to the two inductors 212A, 212B in positions whereby at least one of the field effect transistors 204B is biased in strong inversion and at least one of the field effect transistors 204A is biased in weak inversion.

In particular illustrative embodiments, low noise amplifiers 100 and 200 may be configured as cellular code division multiple access (CDMA) CMOS low noise amplifiers.

Figure 3A:
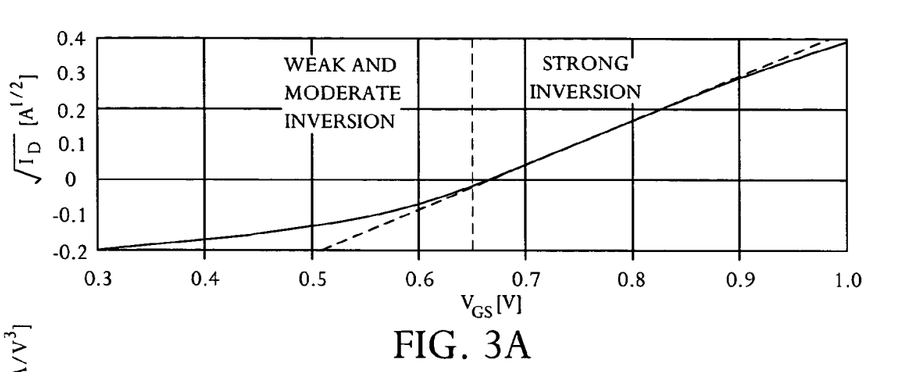
FIGS. 3A, 3B, and 3C are graphs used to illustrate optimum gate biasing.
Figure 3B:
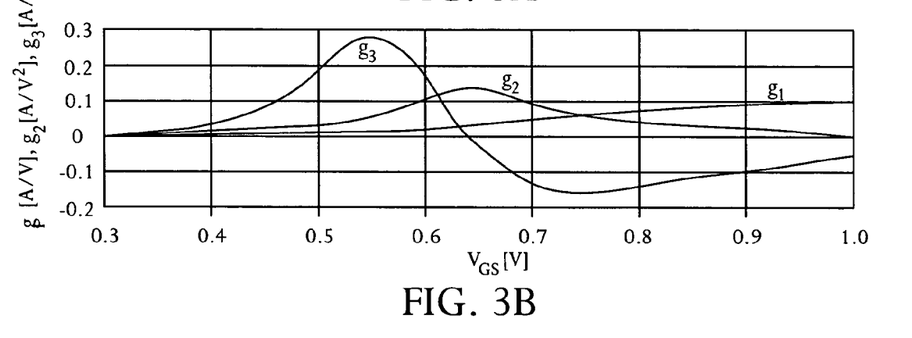
Figure 3C:
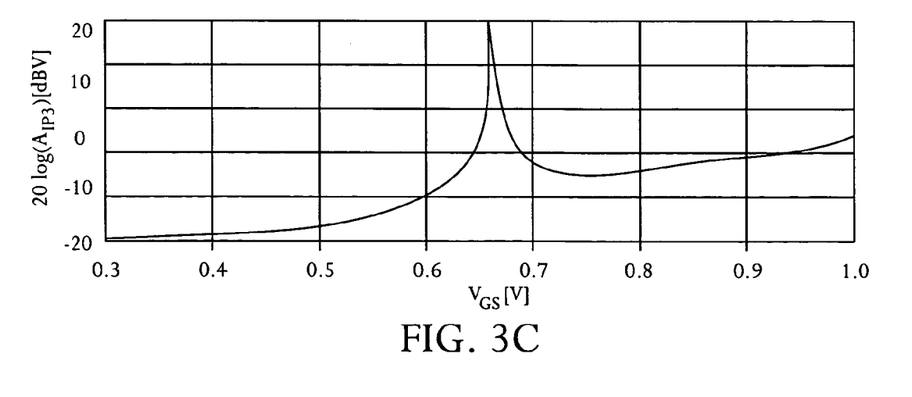

FIGS. 3A, 3B, and 3C are graphs used to illustrate optimum gate biasing. FIG. 3A shows a measured direct current transfer characteristic including a region of weak and moderate inversion, and a region of strong inversion. The direct current transfer characteristic can be measured for a particular field-effect transistor (FET). In one example, the transfer characteristic is measured from a 350 µm-wide FET in a 0.25 µm complementary metal-oxide semiconductor (CMOS) process that can be used to manufacture the illustrative low noise amplifiers. FIG. 3B illustrates power series coefficients $g_1$, $g_2$, and $g_3$. FIG. 3C depicts theoretical amplitude response $A_{IP3}$. The transition region from moderate to strong inversion has a gate-source voltage $V_{GS}$ at which the third order coefficient $g_3$ is equal to zero and therefore amplitude response $A_{IP3}$ is infinite. In an optimum gate biasing method, a field-effect transistor is biased at the voltage $V_{GS}$ of infinite $A_{IP3}$. As shown in FIG. 3C, a significant third-order intercept point $IIP_3$ improvement occurs only in a very small range of $V_{GS}$. The low noise amplifier embodiments depicted in FIG. 1 and FIG. 2 alleviate the limited optimum range of $V_{GS}$.

The low noise amplifier implemented using the derivative superposition method significantly improves input-referred third-order intercept point $IIP_3$ without degrading other parameters of the low noise amplifier. The low noise amplifier configured using the illustrative derivative superposition method is appropriately insensitive to process variations and device mismatches, facilitating usage in high-volume production.

The illustrative derivative superposition method can be used in radio frequency complementary metal-oxide semiconductor (RFCMOS) technology that is typically useful in low cost manufacturing in a manner that attains high-volume production while satisfying single-noise desense criteria in RF CMOS low noise amplifiers, for example for usage for CDMA receivers.

Figure 4A:
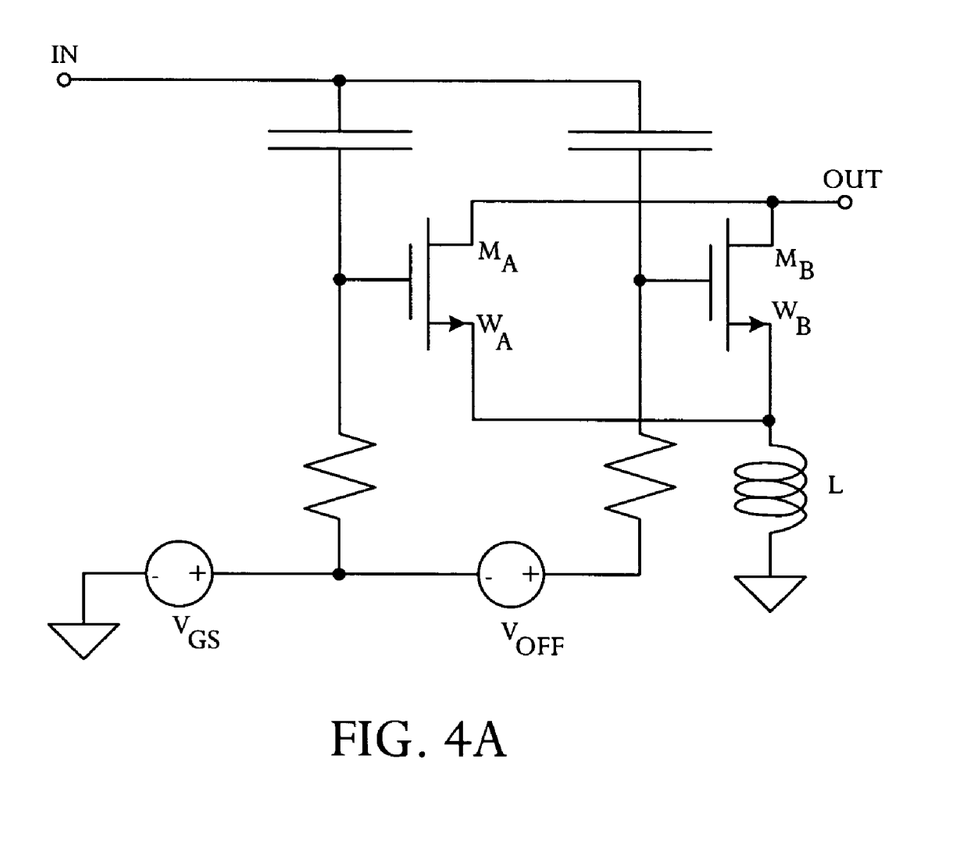
FIGS. 4A, 4B, and 4C depict, respectively, a schematic circuit diagram showing a composite field-effect transistor, and graphs showing third-order power series coefficients, and theoretical amplitude response at DC to illustrate direct current (DC) theory of the derivative superposition method.
Figure 4B:
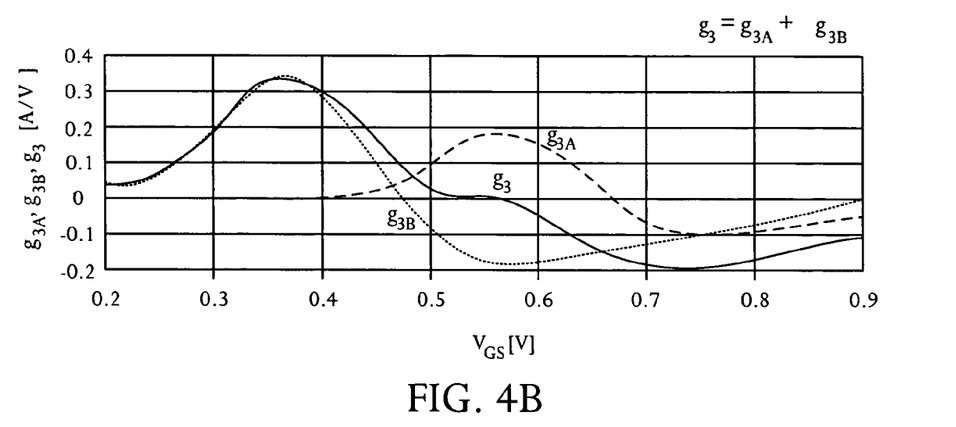
Figure 4C:
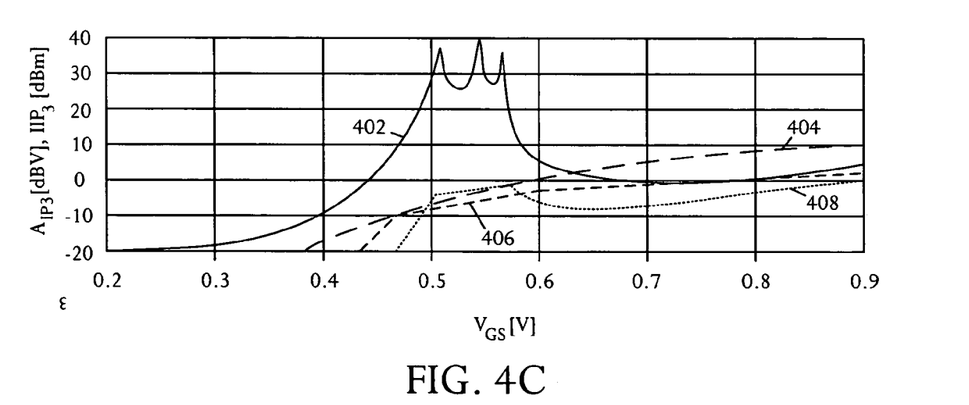

Referring to FIGS. 4A, 4B, and 4C, a schematic circuit diagram showing a composite field-effect transistor, and graphs showing third-order power series coefficients, and theoretical amplitude response at DC respectively illustrate direct current (DC) theory of the derivative superposition method. The composite field-effect transistor is a combination of a first field-effect transistor $M_A$ having a width $W_A$, and a second field-effect transistor $M_B$ having a width $W_B$. In an example used to determine coefficients g and amplitudes A shown in FIGS. 4B and 4C respectively, the width $W_A$ of transistor $M_A$ is 240 µm, the width $W_B$ of transistor $M_B$ is 460 µm, and the offset voltage $V_{OFF}$ is 0.2V. A common-source field-effect transistor biased in saturation generates a small-signal output current that can be expanded into the power series of equation (1) in terms of small-signal gate-source voltage $v_{gs}$ around the bias point:

$$i_d(v_{gs}) = g_1 v_{gs} + g_2 v_{gs}^2 + g_3 v_{gs}^3 + \quad (1)$$

where $g_1$ is small-signal transconductance and higher-order transconductance coefficients $g_2$, $g_3$, etc. define strengths of corresponding nonlinearities. Among the coefficients, $g_3$ has particular importance for controlling third-order intermodulation distortion ($IMD_3$) at low signal levels and thus determining third-order intercept point $IIP_3$, which is expressed according to equation (2) as follows:

$$A_{IP3} = \sqrt{\frac{4}{3}\left|\frac{g_1}{g_3}\right|}. \tag{2}$$

Amplitude $A_{IP3}$ 402 is depicted in the graph in FIG. 4C at low frequencies along with third-order intercept point $IIP_3$ 404 at 880 MHz and inductance L of 2 nH, third-order intercept point $IIP_3$ 406 at 880 MHz and inductance L of 0.5 nH, and third-order intercept point $IIP_3$ 408 at 880 MHz and inductance L of 0.1 nH.

Power series coefficients generally depend on the direct current (DC) gate-source and drain-source voltages, $V_{GS}$ and $V_{DS}$. However, dependence on drain-source voltage $V_{DS}$ for a field-effect transistor in saturation can be neglected. If so, coefficients of equation (1) can be determined according to equations (3) as follows:

$$g_1 = \frac{\partial I_D}{\partial V_{GS}}, \quad g_2 = \frac{\partial^2 I_D}{\partial V_{GS}^2}, \quad g_3 = \frac{\partial^3 I_D}{\partial V_{GS}^3}. \tag{3}$$

Dependence of transconductance coefficient $g_3$ on gate-source voltage $V_{GS}$ is such that transconductance coefficient $g_3$ changes from positive to negative when $V_{GS}$ transitions from the weak and moderate inversion regions to strong inversion (SI) region. A positive $g_3$ with a particular $g_3(V_{GS})$ curvature of one field-effect transistor can be aligned with a negative $g_3$ with a similar, but mirror-image, curvature of another field-effect transistor by off-setting gate biases. In addition, the $g_3$ magnitudes can be equalized through a relative field-effect transistor scaling. The resulting composite $g_3$ becomes close to zero and the theoretical amplitude $A_{IP3}$ becomes significantly improved in a wide range of gate biases, as shown in FIGS. 4B and 4C. However, the improvement in $A_{IP3}$ is only valid for very low frequencies at which the effect of circuit reactance is negligible.

Figure 5:
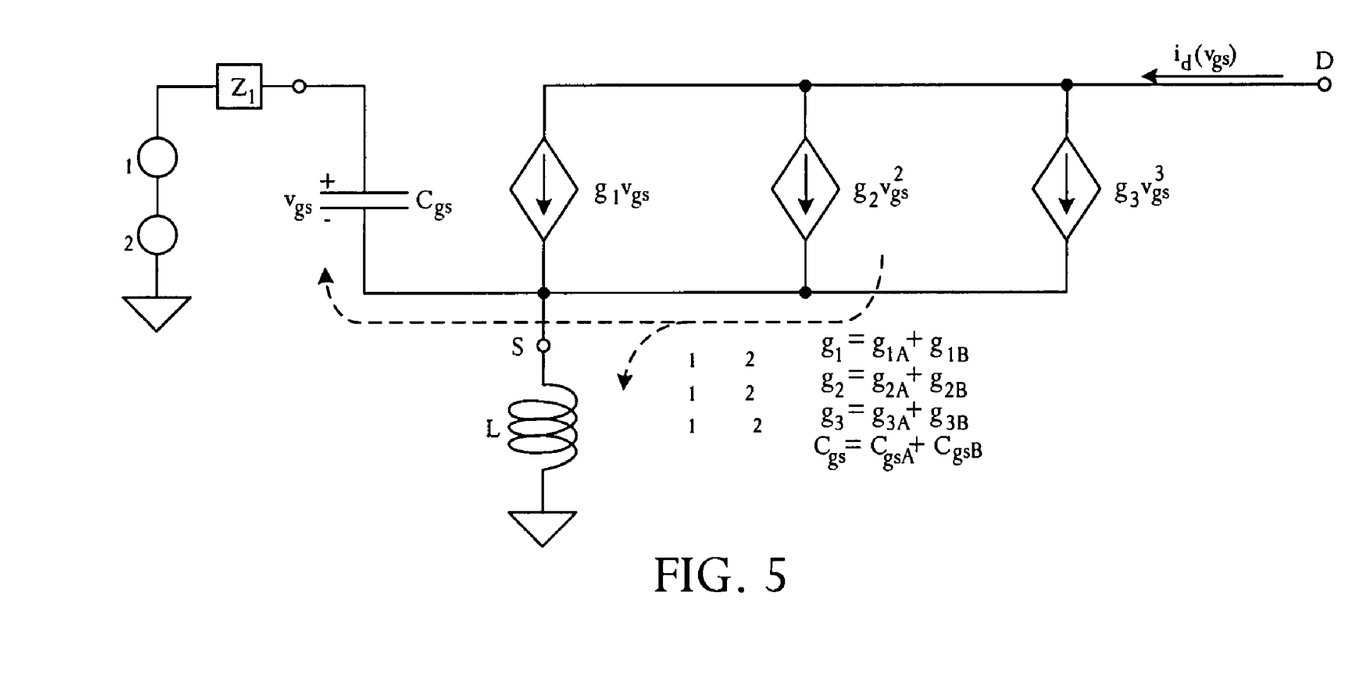
FIG. 5 is a schematic small-signal nonlinear equivalent circuit diagram that illustrates a composite field-effect transistor.

Referring to FIG. 5, a schematic small-signal nonlinear equivalent circuit diagram illustrates a composite field-effect transistor. The small-signal nonlinear equivalent circuit depicts the composite field-effect transistor $(M_A+M_B)$ shown in FIG. 4A. Impedance $Z_1$ is the transformed output impedance of a signal generator and inductance L is source degeneration inductance. The analysis proceeds according to several assumptions. First, body effect is negligible such that $g_{mb}$ is approximately equal to zero. Second, all capacitances are zero except the gate-source capacitance $C_{gs}$. Third, the gate-source capacitance $C_{gs}$ is bias independent and thus linear, an assumption that is only valid in weak and strong inversion regions. Fourth, the field-effect transistor gate and source series resistances and the direct current (DC) resistance of the degeneration inductor are zero. Fifth, the field-effect transistor output conductance is infinite, for instance no channel length modulation exists. Sixth, the input signal is very weak such that current $i_d$ $(v_{gs})$ nonlinearities of the order higher than three are negligible, an assumption that is typical for low noise amplifiers because the amplifiers operate far below the amplifier 1 dB compression point.

In the illustrative weakly nonlinear case with the neglected gate-drain capacitance $C_{gd}$, third-order intermodulation distortion ($IMD_3$) is generated entirely by the $g_3 v_{gs}^3$ component of the drain current if source degeneration inductance L is zero. The source degeneration inductance L creates a feedback path for the drain current to the gate-source voltage $v_{gs}$. The feedback is particularly strong for high frequency spectral components of drain current id. For example, the second harmonics generated by the $g_2 v_{gs}^2$ component are fed back across the gate and source adding to the fundamental components of gate-source voltage $v_{gs}$. The spectral components are mixed in the $g_2 v_{gs}^2$ component to produce responses at frequencies $2\omega_1 \pm \omega_2$ and $2\omega_2 \pm \omega_1$. Accordingly, the second-order linearity of $i_d$ also contributes to third-order intermodulation distortion ($IMD_3$).

Assuming that $\Delta\omega(\omega_2-\omega_1)$ is much smaller than $\omega_1$ and $\omega_2$ such that $j\Delta\omega L$ is approximately equal to zero and the signal generator is conjugately matched to the field-effect transistor input at $\omega$ (so that $\omega$, $\omega_1$, and $\omega_2$ are mutually approximately equal), then third-order intercept point $IIP_3$ can be derived according to equation (4) as follows:

$$IIP_3 = 4g_1^2 \omega^2 L C_{gs}/(3|\epsilon|) \tag{4}$$

where:

$$\varepsilon = g_3 - \frac{2g_2^2/3}{g_1 + \dfrac{1}{j2\omega L} + j2\omega C_{gs} + Z_1(2\omega)\dfrac{C_{gs}}{L}}. \tag{5}$$

Equations (4) and (5) express a condition that reduction of transconductance coefficient $g_3$ to zero does not result in an infinite third-order intercept point $IIP_3$ as results at low frequencies due to the second term in equation (5). The second term in equation (5) represents the contribution of the second-order nonlinearity to third-order intermodulation distortion ($IMD_3$). In conformity to the equation, the second-order nonlinearity contribution depends on the degeneration inductance L. FIG. 4C shows third-order intercept point $IIP_3$ calculated at 880 MHz using equations (4) and (5) for the composite field-effect transistor in FIG. 4A with an input matching circuit including a series capacitor and shunt inductor. The source degeneration inductance significantly suppresses the high-frequency third-order intercept point $IIP_3$ peaking at $V_{GS}$ where coefficient $g_3$ is close to zero. In fact, for realistic values of source degeneration inductance L, which are limited by the downbond inductance ($\approx$0.5 nH), the conventional derivative superposition method supplies no third-order intercept point $IIP_3$ improvement at all.

According to equation (5), the second-order contribution to third-order intermodulation distortion ($IMD_3$) is minimized in the presence of a nonzero inductance L by increasing impedance $Z_1$ ($\omega$). However, the feedback through the neglected gate-drain capacitance $C_{gd}$ becomes significant, which also leads to the second-order contribution to third-order intermodulation distortion ($IMD_3$). To completely eliminate the second-order contribution and attain a significant third-order intercept point $IIP_3$ improvement using the derivative superposition method, the gate and drain termination of the composite field-effect transistor at the second-harmonic frequency is optimized. One of the terminations is to have a negative real part, resulting in potential instability of the amplifier. A noticeable third-order intercept point $IIP_3$ improvement using conventional derivative superposition techniques can be attained by simply minimizing the source degeneration inductance and the drain load impedance. However, with a very small inductance L, simultaneously attaining a good voltage standing wave ration (VSWR) and noise factor (NF) is difficult, probably resulting in the poor gain and noise factor (NF) characteristics of the low noise amplifier, for example about 10 dB and 2.85 dB respectively at 900 MHz.

In a particular example, the derivative superposition method can be implemented using two field-effect transistors, one biased in the weak inversion (WI) region and the other biased in strong inversion (SI). Intuitively, the overall noise factor of the composite field-effect transistor should be dominated by the field-effect transistor in strong inversion, which draws approximately twenty times more current than the field-effect transistor in weak inversion. The intuition is confirmed by simulations using Berkeley Short-Channel IGFET Metal Oxide Semiconductor (BSIM3v3) models. However, measured data has been found to disagree with the intuitive and BSIM results.

The most significant MOSFET noise sources at radio frequency (RF) are drain current noise and induced gate noise respectively expressed in equations (6) and (7) as follows:

$$\overline{i_{nd}^2} = 4kT\Delta f \gamma g_{do}, \qquad (6)$$

$$\overline{i_{ng}^2} = 4kT\Delta f \delta \frac{\omega^2 C_{gs}^2}{5 g_{do}}, \qquad (7)$$

where $\square$ and $\square$ are bias-dependent noise coefficients and $g_{d0}$ is drain-source conductance at zero $V_{DS}$. For a long-channel field-effect transistor in strong inversion, $g_{d0}=2I_{D,sat}/(V_{GS}-V_{TH})$ where $I_{D,sat}$ is the drain saturation current and $V_{TH}$ is threshold voltage. The two noise currents are partially correlated, with a correlation coefficient defined according to equation (8) as follows:

$$c = \overline{i_{ng} \cdot i_{nd}^*}/\sqrt{\overline{i_{ng}^2} \cdot \overline{i_{nd}^2}}. \qquad (8)$$

The values of $\square$, $\square$, and c have been derived by van der Ziel in *Noise in Solid State Devices and Circuits*, New York: Wiley, 1986, for a long channel device in strong inversion. For a saturated field-effect transistor, $\square=2/3$, $\square=4/3$, and c=j0.395. Short-channel values of $\square$ and $\square$ are two to three times larger. For simplicity, short-channel effects can be neglected. Extending the van der Ziel model for a field-effect transistor in weak inversion, derived long channel values are $\square=1/2$, $\square=5/4$, and c=j0.707. Since drain current in weak inversion results from diffusion, conductance $g_{D0}$ is $I_{D,sat}/\square_t$ where $\square_t$ is the thermal voltage kT/q. Substituting $g_{d0}$ into equation (7) clarifies an interesting observation. While the field-effect transistor in weak inversion draws a negligible drain current, the transistor induced gate noise is inversely proportional to the drain current and, thus, can be quite significant, adding to the induced gate noise current of the field-effect transistor in strong inversion and degrading the overall noise factor in the derivative superposition method. The modified implementation of the derivative superposition technique shown in FIGS. 1 and 2 alleviates or prevents this difficulty.

Figure 6A:
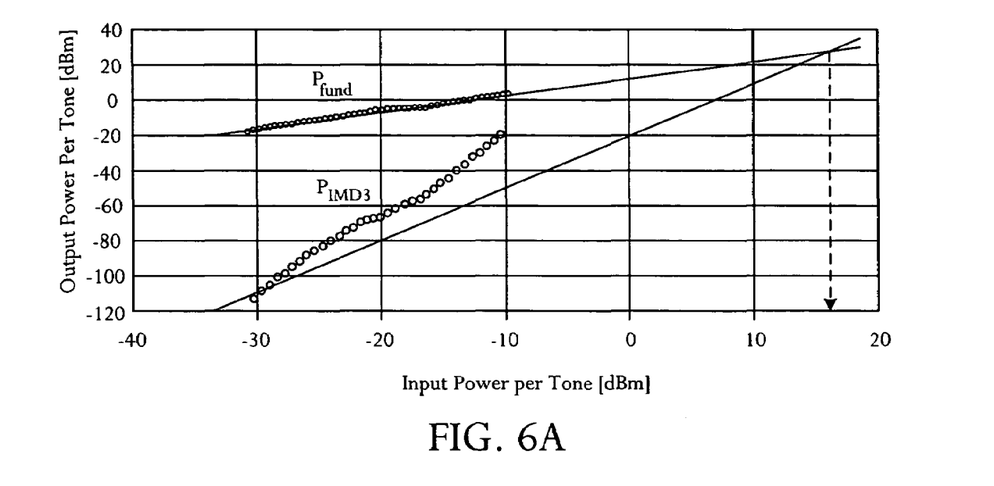
FIGS. 6A and 6B are graphs respectively illustrating measured characteristics of a low noise amplifier embodiment configured in accordance with the illustrative derivative superposition method.
Figure 6B:
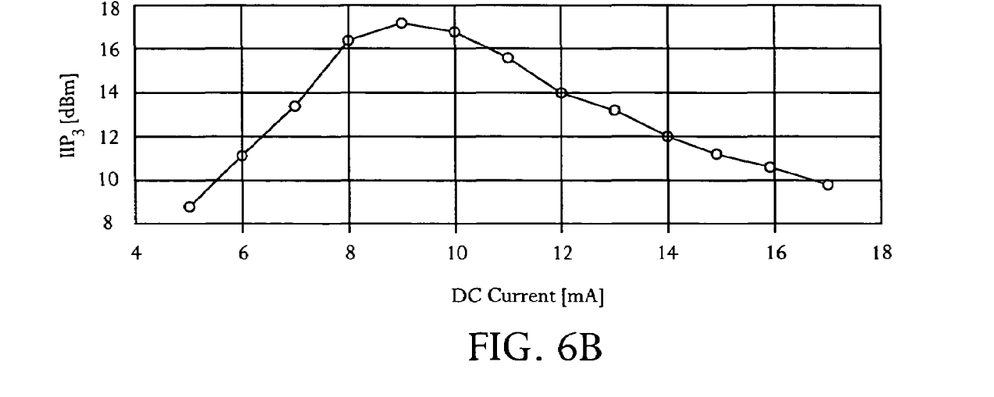

Referring to FIGS. 6A and 6B, graphs respectively illustrate measured characteristics of a low noise amplifier embodiment configured in accordance with the illustrative derivative superposition method. FIG. 6A shows measured two-tone transfer characteristics in a plot relating output power and input power per tone. FIG. 6B shows measured third-order intercept point IIP$_3$ at P$_{in}$ at −30 dB as a function of combined DC current of the input field-effect transistors. The low noise amplifier designed according to the illustrative derivative superposition method was manufactured in a 0.25 µm Si CMOS technology as part of a cellular CMDA zero-Intermediate Frequency (IF) receiver and packaged in a quad flat no-lead (QFN) 32-pin package. Measured power gain and noise factor of the amplifier are 15.5 dB and 1.6 dB respectively with current consumption of 9 mA from 2.6V excluding the bias circuit. Input and output losses are lower than −11 dB. The low noise amplifier third-order intercept point IIP$_3$ was tested with two tones at 880 MHz and 880.5 MHz. Measured output powers of the fundamental and third-order intermodulation distortion (IMD$_3$) responses as functions of the input power per tone are plotted in FIG. 6A. The P$_{IMD3}$ (P$_{in}$) curve 602 rises with a slope steeper than 3:1 at the measured power levels, which means that the composite third-order nonlinearity is negligible and the third-order intermodulation distortion (IMD$_3$) is dominated by fifth and higher order nonlinearities. As a result, third-order intercept point IIP$_3$ is a function of P$_{in}$. At P$_{in}$=−30 dBm, third-order intercept point IIP$_3$=+17.2 dBm. The third-order intercept point IIP$_3$ has also measured for different values of master reference current with the ratio of the reference currents for the two field-effect transistors I$_{RA}$/I$_{RB}$ maintained constant. FIG. 6B shows the low noise amplifier maintains high third-order intercept point IIP$_3$ in a wide range of the DC current through the composite field-effect transistor. The attained third-order intercept point IIP$_3$ was verified to be insensitive to the input and output harmonic terminations.

The low noise amplifier was also manufactured with a single input field-effect transistor and attained 16 dB gain, +2 dBm third-order intercept point IIP$_3$, and 1.4 dB noise factor (NF) with 9 mA DC current. Accordingly, the proposed modified derivative superposition method boosted third-order intercept point IIP$_3$ by about 15 dB but degraded noise factor by 0.2 dB due to induced gate noise of the field-effect transistor biased in weak inversion. The noise factor degradation is a common drawback of all derivative superposition-based methods.

Table I compares dynamic range figures of merit (FOM) defined with respect to output third-order intercept point (OIP$_3$), noise factor (NF) and DC power (P$_{dc}$) as OIP$_3$/[(NF−1)$\square$P$_{dc}$]. Characteristics of the low noise amplifier designed according to the illustrative modified derivative superposition method are compared to other state-of-the-art FET LNAs. Table I shows that the low noise amplifier using the modified derivative superposition method has the highest figures of merit.

TABLE I

| Work | Technology | Freq (GHz) | S21 dB | NF dB | IIP$_3$ dBm | P$_{dc}$ mA@V | FOM |
|---|---|---|---|---|---|---|---|
| current | 0.25 µm Si CMOS | 0.9 | 15.5 | 1.6 | +17.2 | 9@2.6 | 179 |
| (A) | 0.25 µm Si CMOS | 0.9 | 14.6 | 1.8 | +10.5 | 2@2.7 | 117 |
| (B) | 0.6 µm GaAs MESFET | 0.9 | 17 | 1.6 | +8.5 | 4.7@2.7 | 62.8 |
| (C) | 0.25 µm Si CMOS | 2.2 | 14.9 | 3 | +16.1 | 9.4@2.5 | 53.8 |
| (D) | 0.35 µm Si CMOS | 0.9 | 10 | 2.8 | +15.6 | 7.8@2.7 | 19 |
| (E) | 0.35 µm Si CMOS | 0.9 | 2.5 | 2.8 | +18 | 15@3 | 3 |

(A)—V. Aparin, G. Brown, and L. E. Larson, "Linearization of CMOS LNAs via optimum gate biasing," IEEE Int. Symp. On Circ. And Sys., accepted for publication, May 2004.
(B)—Oek, 2002.
(C)—Youn, 2003.
(D)—T. W. Kim, B. Kim, and K. Lee, "Highly linear receiver front-end adopting MOSFET transconductance linearization by multiple gated transistors," IEEE J. Solid-State Circuits, vol. 39, no. 1, pp. 223-229, January 2004.
(E)—Y. Ding and R. Harjani, "A + 18 dBm IIP3 LNA in 0.35 CMOS," IEEE ISSCC, pp. 162-163, 2001.

Figure 7:
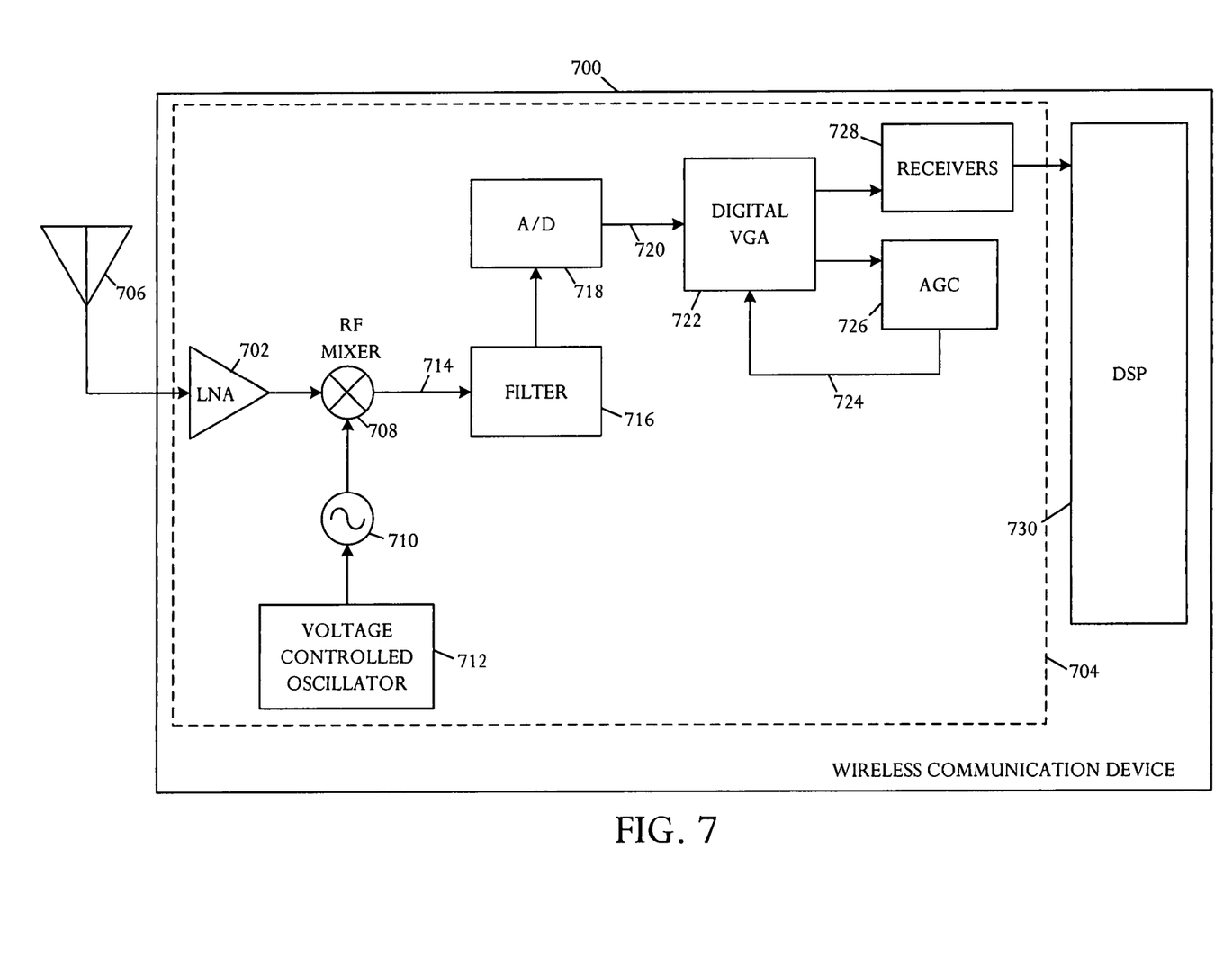
FIG. 7 is a schematic block diagram depicting an embodiment of a wireless communication device that can use a low noise amplifier configured using the illustrative derivative superposition method.

Referring to FIG. 7, a schematic block diagram illustrates an embodiment of a wireless communication device 700 that can use a low noise amplifier 702 configured using the illustrative derivative superposition method. The illustrative wireless communication device 700 comprises a receiver 704 capable of receiving radio frequency signals and including a low noise amplifier 702 further comprising a source degeneration inductance and at least two field effect transistors coupled in parallel and having mutually different gate biasing. As shown in FIGS. 1 and 2, source connections of the field effect transistors are coupled along different positions of the source degeneration inductance.

In an illustrative embodiment, the wireless communication device 700 incorporates code division multiple access (CDMA) signal modulation techniques to conduct multiple communications simultaneously over a radio frequency bandwidth.

The example shows a receiver 704 of a wireless communication device 700 that implements a Zero Intermediate Frequency (IF) architecture, although any suitable architecture may otherwise be used. The wireless communication device 700 includes an antenna 706 that receives incoming radio frequency signals. In some examples, the radio frequency (RF) signals may be code division multiple access (CDMA) modulated signals that are received from a CDMA base station. The RF signal can be passed through a low noise amplifier 702 before mixing down to baseband by radio frequency (RF) mixer 708. The mixer 708 may receive carrier waveforms produced by a frequency synthesizer 710 using a local clock as a timing reference. The local clock may be a voltage-controlled oscillator 712, for example. Other components may be included in the wireless communication device 700.

RF mixer 708 produces a baseband signal 714 which can be filtered by a filter 716, and sampled by analog-to-digital converter 718 to produce corresponding digital values of the signal, for example a digital baseband signal 720. Digital voltage gain amplifier (VGA) 722 scales the digital baseband signal 720 either by amplifying or attenuating the digital values, according to a logarithmic gain value 724 received from automatic gain control (AGC) unit 726.

After scaling by the digital VGA 722, the scaled digital baseband signal is supplied to receivers 728 which separate and track signals received from different sources, for example different baseband stations. In some examples, receivers 728 may perform various functions such as dispreading, Walsh decovering and accumulation, pilot time and frequency tracking, and the like. The receivers 728 can supply pilot and data symbols to corresponding paths of a digital signal processor (DSP) 730 that performs symbol demodulation and/or other signal processing.

In various embodiments, implementations, and designs, the low noise amplifier 702 and/or other low noise amplifiers that can be incorporated into various wireless communication devices 700 may be implemented using any suitable semiconductor technology. Appropriate semiconductor technologies may include Complementary Metal-Oxide Semiconductor (CMOS), Metal-Oxide Semiconductor Field-Effect Transistor (MOSFET), Metal Semiconductor Field-Effect Transistor (MESFET), Silicon-Carbon (SiC) MESFET, Gallium-Arsenide (GaAs) MESFET, Lateral Diffusion MOS-FET (LDMOS FET), Silicon (Si) LDMOS FET, Heterojunction Bipolar Transistor (HBT), GaAs HBT, Indium Phosphide (InP) HBT, Silicon Germanium (SiGe) HBT, Indium Gallium Phosphide (InGaP) HBT, High Electron Mobility Transistor (HEMT), Aluminum Gallium Arsenide (AlGaAs) pseudomorphic High Electron Mobility Transistor (pHEMT), GaAs pHEMT, Aluminum Gallium Nitride/Gallium Nitride) AlGaN/GaN HEMT, and Aluminum Gallium Arsenide/Indium Gallium Arsenide (AlGaAs/InGaAs) HEMT.

Figure 8:
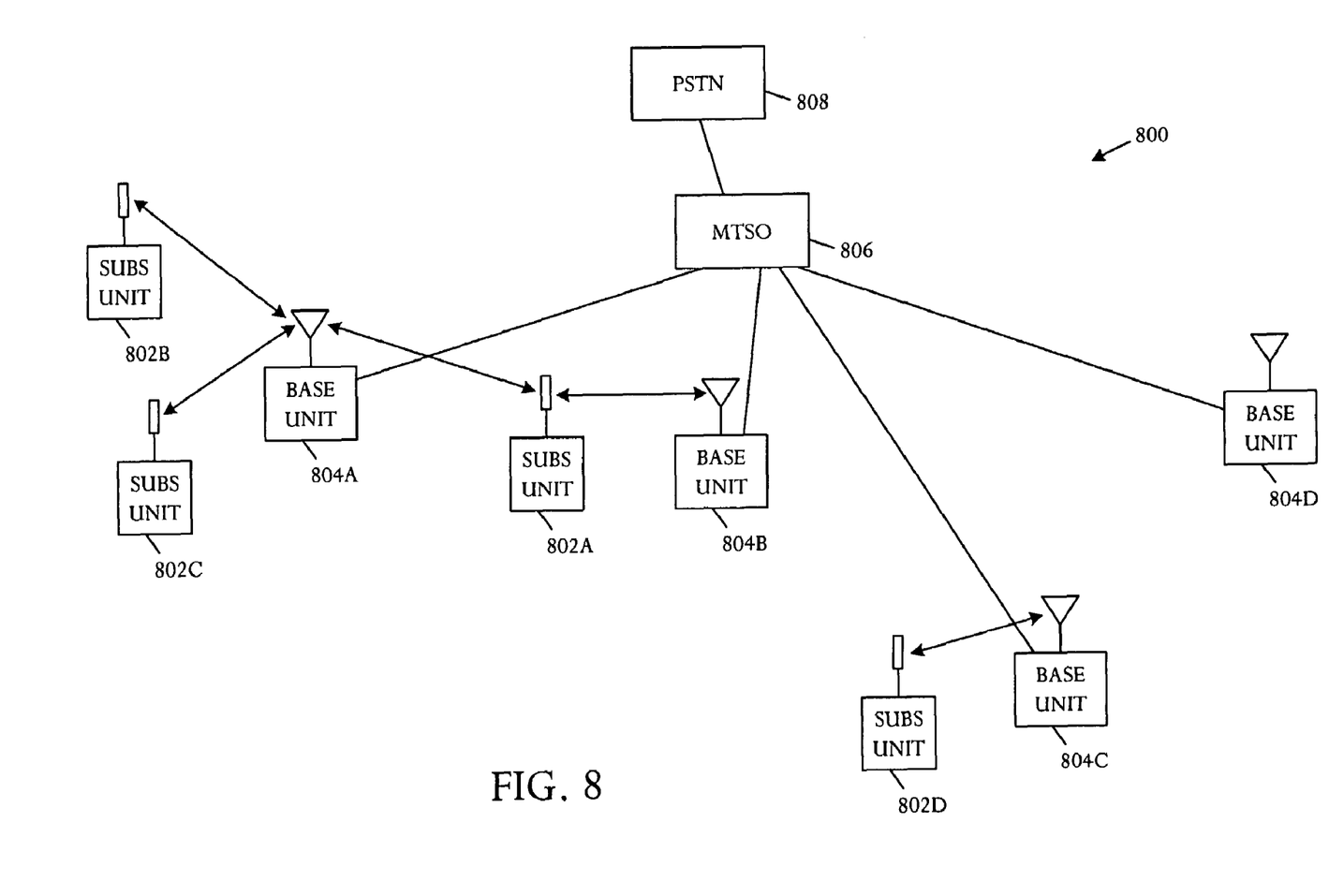
FIG. 8 is a highly simplified block diagram depicting an implementation of a cellular telephone system that may include wireless communication devices incorporating linearized field-effect transistor low noise amplifiers according to FIGS. 1 and 2.

Referring to FIG. 8, a highly simplified block diagram depicts an implementation of a cellular telephone system 800. During operation, a set of subscriber units 802A-D conduct wireless communication by establishing one or more radio frequency (RF) interfaces with one or more base stations 804A-D using CDMA-modulated RF signals. Each RF interface between a base station 804A-D and a subscriber unit 802A-D includes a forward link signal transmitted from a base station 804A-D and a reverse link signal transmitted from the subscriber unit 802A-D. Using the RF interfaces, a communication with another user is generally conducted through a mobile telephone switching office (MTSO) 806 and a public switch telephone network (PSTN) 808. The links between the base stations 804A-D, mobile telephone switching office (MTSO) 806, and public switch telephone network (PSTN) 808 are typically formed via wire connections, although the use of additional RF or microwave links may otherwise or additionally be used.

The illustrative low noise amplifier that is configured using derivative superposition methods can be used in various wireless communication devices, such as cellular radiotelephones, computers incorporating at least one Personal Computer Memory Card International Association (PCMCIA) communication cards, personal digital assistants (PDAs) equipped with wireless communication capabilities, base stations, subscriber units, and switches including mobile telephone switching office (MTSO) and public switch telephone network (PSTN) switches.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, components, and dimensions can be varied to achieve the desired structure as well as modifications, which are within the scope of the claims. For example, the illustrative methods and structures can be used in any suitable semiconductor technology and is not limited those particularly named. Furthermore, the structures and methods can be used in any appropriate amplifiers, receivers, and communication devices other than those described and named. In addition, the disclosed structures and methods can be used in any suitable applications, extending beyond the particular applications described.

What is claimed:

1. An amplifier comprising:
   a source degeneration inductance, wherein the source degeneration inductance is a tapped inductor; and
   at least two field effect transistors coupled in parallel and having mutually different gate biasing, source connections of the at least two field effect transistors being coupled along different positions of the source degeneration inductance, wherein the source connections of the at least two field effect transistors are coupled to taps of the source generation inductance whereby at least one of the field effect transistors is biased in strong inversion and at least one of the field effect transistors is biased in weak inversion.

2. An amplifier comprising:

a source degeneration inductance; and at least two field effect transistors coupled in parallel and having mutually different gate biasing, source connections of the at least two field effect transistors being coupled along different positions of the source degeneration inductance, wherein the source degeneration inductance includes at least two inductors coupled in series with source connections of the at least two field effect transistors coupled to the at least two inductors in positions whereby at least one of the field effect transistors is biased in strong inversion and at least one of the field effect transistors is biased in weak inversion.

3. An amplifier comprising:

a source degeneration inductance; and at least two field effect transistors coupled in parallel and having mutually different gate biasing, source connections of the at least two field effect transistors being coupled along different positions of the source degeneration inductance, wherein the gate biasing of the at least two field effect transistors is configured whereby a second-order contribution to third-order intermodulation distortion (IMD3) is the same magnitude and opposite phase of a third-order contribution.

4. An amplifier comprising:

a source degeneration inductance; and at least two field effect transistors coupled in parallel and having mutually different gate biasing, source connections of the at least two field effect transistors being coupled along different positions of the source degeneration inductance, wherein the at least two field effect transistors further comprise first and second transistors each having a gate coupled to a common input signal, a mutually coupled drain, and a source coupled respectively to the source generation inductance in an arrangement whereby the first transistor (T1) is biased in weak inversion with a positive associated third-order transconductance coefficient ($g_{3T1}$) and the second transistor (T2) is biased in strong inversion with a negative associated third-order transconductance coefficient ($g_{3T2}$).

5. The amplifier according to claim 4 wherein:

the first transistor (T1) source connection to the source degeneration inductance is arranged whereby magnitude and phase of the associated third-order transconductance coefficient ($g_{3T1}$) contribution to the third-order-intermodulation distortion ($IMD_3$) is modified relative to second transistor (T2)-associated second-order transconductance coefficient ($g_{2T2}$) and third-order transconductance coefficient ($g_{3T2}$) contributions.

6. A method for linearizing an amplifier comprising:

coupling a plurality of field effect transistors in parallel; and connecting sources of the field effect transistors to a source degeneration inductance at different positions along the inductance, wherein the source connections of the plurality of field effect transistors are coupled to taps of the source generation inductance whereby at least one of the field effect transistors is biased in strong inversion and at least one of the field effect transistors is biased in weak inversion.

7. The method according to claim 6 further comprising:

selecting positions for connecting the field effect transistor sources to the source degeneration inductance whereby a second-order contribution to third order intermodulation distortion ($IMD_3$) is approximately equal in magnitude and opposite in phase with a third-order contribution.

8. The method according to claim 6 further comprising:

connecting the field effect transistor sources to a tapped source degeneration inductor to adjust magnitude and phase of the third-order contribution to the third-order intermodulation distortion ($IMD_3$).

9. The method according to claim 6 further comprising:

modifying magnitude and phase of an associated third-order transconductance coefficient ($g_{3T1}$) contribution to third-order intermodulation distortion ($IMD_3$) relative to second transistor (T2)-associated second-order transconductance coefficient ($g_{2T2}$) and third-order transconductance coefficient ($g_{3T2}$) contributions.

10. The method according to claim 6 further comprising:

biasing a first field effect transistor of the field effect transistor plurality in weak inversion; and biasing a second field effect transistor of the field effect transistor plurality in strong inversion.

11. A wireless communication device comprising:

a receiver capable of receiving radio frequency signals and including a low noise amplifier further comprising:

a source degeneration inductance; and at least two field effect transistors coupled in parallel and having mutually different gate biasing, source connections of the at least two field effect transistors being coupled along different positions of the source degeneration inductance, wherein the source degeneration inductance is a tapped inductor and source connections of the at least two field effect transistors are coupled to taps of the source generation inductance whereby at least one of the field effect transistors is biased in strong inversion and at least one of the field effect transistors is biased in weak inversion.

12. The device according to claim 11 wherein the wireless communication device is selected from among a group consisting of:

cellular radiotelephones;

computers incorporating at least one Personal Computer Memory Card International Association (PCMCIA) communication cards;

personal digital assistants (PDAs) equipped with wireless communication capabilities;

base stations;

subscriber units; and, switches including mobile telephone switching office (MTSO) and public switch telephone network (PSTN) switches.

13. The device according to claim 11 wherein the wireless communication device incorporates code division multiple access (CDMA) signal modulation techniques to conduct multiple communications simultaneously over a radio frequency bandwidth.

14. The device according to claim 11 wherein the low noise amplifier applies a semiconductor technology selected from among a group consisting of:

Complementary Metal-Oxide Semiconductor (CMOS), Metal-Oxide Semiconductor Field-Effect Transistor (MOSFET), Metal Semiconductor Field-Effect Transistor (MESFET), Silicon-Carbon (SiC) MESFET, Gallium-Arsenide (GaAs) MESFET, Lateral Diffusion MOSFET (LDMOS FET), Silicon (Si) LDMOS FET, Heterojunction Bipolar Transistor (HBT), GaAs HBT, Indium Phosphide (InP) HBT, Silicon Germanium (SiGe) HBT, Indium Gallium Phosphide (InGaP) HBT, High Electron Mobility Transistor (HEMT), Aluminum Gallium Arsenide (AlGaAs) pseudomorphic High Electron Mobility Transistor (pHEMT), GaAs pHEMT, Aluminum Gallium Nitride1 Gallium Nitride) AlGaN/GaN HEMT, and Aluminum Gallium Arsenide/Indium Gallium Arsenide (AlGaAs/InGaAs) HEMT.

15. A wireless communication device comprising:
a receiver capable of receiving radio frequency signals and including a low noise amplifier further comprising:
   a source degeneration inductance; and
   at least two field effect transistors coupled in parallel and having mutually different gate biasing, source connections of the at least two field effect transistors being coupled along different positions of the source degeneration inductance, wherein the source degeneration inductance includes at least two inductors coupled in series with source connections of the at least two field effect transistors coupled to the at least two inductors in positions whereby at least one of the field effect transistors is biased in strong inversion and at least one of the field effect transistors is biased in weak inversion.

16. A wireless communication device comprising:
a receiver capable of receiving radio frequency signals and including a low noise amplifier further comprising:
   a source degeneration inductance; and
   at least two field effect transistors coupled in parallel and having mutually different gate biasing, source connections of the at least two field effect transistors being coupled along different positions of the source degeneration inductance, wherein the gate biasing of the at least two field effect transistors is configured whereby a second-order contribution to third-order intermodulation distortion ($IMD_3$) is the same magnitude and opposite phase of a third-order contribution.

17. A wireless communication device comprising:
a receiver capable of receiving radio frequency signals and including a low noise amplifier further comprising:
   a source degeneration inductance; and
   at least two field effect transistors coupled in parallel and having mutually different gate biasing, source connections of the at least two field effect transistors being coupled along different positions of the source degeneration inductance, wherein the at least two field effect transistor further comprise first and second transistors each having a gate coupled to a common input signal, a mutually coupled drain, and a source coupled respectively to the source generation inductance in an arrangement whereby the first transistor (T1) is biased in weak inversion with a positive associated third-order transconductance coefficient ($g_{3T1}$) and the second transistor (T2) is biased in strong inversion with a negative associated third-order transconductance coefficient ($g_{3T2}$).

18. The amplifier according to claim 17 wherein:
the first transistor (T1) source connection to the source degeneration inductance is arranged whereby magnitude and phase of the associated third-order transconductance coefficient ($g_{3T1}$) contribution to the third-order intermodulation distortion ($IMD_3$) is modified relative to second transistor (T2)-associated second-order transconductance coefficient ($g_{2T2}$) and third-order transconductance coefficient ($g_{3T2}$) contributions.

19. An apparatus comprising:
means for coupling a plurality of field effect transistors in parallel; and
means for connecting sources of the field effect transistors to a source degeneration inductance at different positions along the inductance, wherein the source connections of the plurality of field effect transistors are coupled to taps of the source generation inductance whereby at least one of the field effect transistors is biased in strong inversion and at least one of the field effect transistors is biased in weak inversion.

* * * * *